United States Patent [19]

Ballatore

[11] Patent Number: 5,175,449
[45] Date of Patent: Dec. 29, 1992

[54] CIRCUIT FOR TESTING THE FREQUENCY OF A CLOCK IN AN ELECTRONIC SYSTEM

[75] Inventor: Daniel Ballatore, Gourdon, France

[73] Assignee: International Business Machines Corporation, Armonk, N.Y.

[21] Appl. No.: 752,293

[22] Filed: Aug. 30, 1991

[30] Foreign Application Priority Data

Oct. 31, 1990 [EP] European Pat. Off. ........ 90480172.7

[51] Int. Cl.⁵ .......................................... H03D 13/00
[52] U.S. Cl. .................... 307/526; 307/522; 307/523; 328/134; 328/141
[58] Field of Search .............................. 307/522–525; 328/133, 134, 141

[56] References Cited

U.S. PATENT DOCUMENTS

| | | | |
|---|---|---|---|
| 4,277,754 | 7/1981 | Minakuchi | 307/525 |
| 4,291,274 | 9/1981 | Suzuki et al. | 307/526 |
| 4,354,124 | 10/1982 | Shima et al. | 307/522 |
| 4,513,427 | 4/1985 | Borriello et al. | 375/110 |
| 4,843,332 | 6/1989 | Cok et al. | 307/526 |
| 4,884,035 | 11/1989 | Cok et al. | 328/133 |
| 4,928,026 | 5/1991 | Ebesyu | 328/133 |
| 4,940,952 | 7/1991 | Kegasa | 328/155 |
| 5,126,602 | 6/1992 | Lee et al. | 307/510 |

*Primary Examiner*—William L. Sikes
*Assistant Examiner*—Terry D. Cunningham
*Attorney, Agent, or Firm*—H. Daniel Schnurmann

[57] ABSTRACT

A clock frequency tester circuit for determining whether the frequency of a clock (FB) is comprised within a predetermined range (FA−FA/n, FA+FA/n) centered around a reference frequency (FA), is described. The clock frequency tester circuit includes a frequency mixer which provides an output frequency FQ in accordance with the relation: FQ=absolute value of (FA−FB), for a frequency FB close to FA, and a divide-by-n circuit which divides the frequency FB of the clock to be tested. The frequency tester further includes a phase frequency comparator which has a first and second input lead F1 and F2 which are, respectively, connected to the output of the divide-by-n circuit and to the output of the frequency mixer. The phase frequency comparator generates an output signal Q2 which remains at a steady level whenever F1 input signal has a frequency which is higher than that of the input signal F2, i.e., when the frequency FB to be tested is comprised within the range (FA−FA/n, FA+FA/n) (for a frequency FB close to FA). Since the factor n can be easily adjusted, any desired degree of accuracy can be provided by the frequency tester circuit disclosed.

11 Claims, 8 Drawing Sheets

CIRCUIT FOR TESTING THE FREQUENCY OF A CLOCK IN AN ELECTRONIC SYSTEM

FIELD OF THE INVENTION

This invention relates to a timing circuit for electronic systems and more particularly to a device for testing the characteristics of a clock.

BACKGROUND OF THE INVENTION

Circuits for testing timing and more particularly for testing the characteristics of clocks are of general interest in the data processing and communication fields.

It is well known to those skilled in the art of data processing that there has been a general tendency to improve the performance of systems by increasing speed, thereby requiring electronic components to be clocked at higher and higher speeds. Thus, components are used at a frequency near their critical frequency, over which failures are more prone to occur. Clocks which are normally used to drive the electronic components require close checking to ensure that they operate at the desired frequency. Conversely, the technology of DRAM requires that a Dynamic Random Access Memory be regularly refreshed in order to save its contents. In this case, the refreshing frequency also requires checking to ensure that it remains below the critical refreshing frequency of the DRAM, at which value the contents of a DRAM may unfortunately be destroyed.

In the data communication field, the transmission of data over telecommunication lines at high speed also entails the need for timing circuits and clocks with accurate and constant characteristics.

A need therefore exists in telecommunication and data processing for a device which tests the value of the frequency of a clock and, more particularly, which determines whether this frequency is within a predetermined range. Furthermore, it is desirable that this range of frequencies be easily adaptable to changes as a function of a desired level of accuracy.

OBJECTS OF THE INVENTION

Accordingly, it is an object of the present invention to provide a frequency tester circuit which indicates whether the frequency of a clock is comprised within a predetermined range of values.

It is a further object of the invention to provide a frequency tester circuit which allows easy adjustments to its frequency range.

It is another object of the invention to provide a simple and low cost frequency tester circuit which checks the accuracy and stability of a clock used in a data communication or data processing system.

SUMMARY OF THE INVENTION

These and other objects of the invention are provided by a clock frequency tester circuit which indicates whether the frequency of a clock FB is comprised within a predetermined range (FA-FA/n, FA+FA/n) centered around the reference frequency FA of a reference clock. The clock frequency tester includes a frequency mixer which provides an output frequency FQ in accordance with the relation:

$$FQ = \text{absolute value of } (FA - FB),$$

in which FB has a frequency that approximates that of FA, and a divide-by-n circuit which divides the frequency FB of the clock to be tested. The frequency tester further includes a phase frequency comparator which has first and second input leads F1 and F2, respectively connected to the output of the divide-by-n circuit and to the output of the frequency mixer. The phase frequency comparator generates an output signal which remains at a steady level whenever F1 input signal is at a frequency higher than that of the input signal F2 i.e., when the frequency FB to be tested is comprised within the range (FA−FA/n, FA+FA/n). Since the factor n can be easily adjusted, any desired degree of accuracy can be provided by the circuit described in the present invention.

According to a preferred embodiment of the invention, the frequency mixer is a D-latch with a clock-input connected to the FA reference clock and a D-input attached to the clock to be tested. The mixer therefore provides an output signal which has a frequency comprised between 0 and FA/2 for any frequency FB varying from 0 to infinity, in accordance with the relationship:

$$FQ = \text{absolute value of } (kFA - FB)$$

where $k = 0, 1, 2, 3, \ldots$

The phase frequency comparator, consequently, entails the generation of a steady output level whenever the ratio FB/FA is less than 1/n or comprised within the range (k-1/n, k+1/n), where $k = 1, 2, 3, \ldots$, (i.e., whenever the tested frequency has a frequency close to a multiple of FA).

According to another preferred embodiment of the invention, the frequency tester further includes a second (alt., a third/phase frequency comparator which has two input leads F'1 and F'2 (alt., F''1 and F''2), respectively, receiving FA/2 and FB/3 (alt., FB and FA/2), and which provides a steady output signal whenever the frequency of its former input F'1 (alt. F''1) is higher than that of input F'2 (alt., F''2) and whenever the ratio FB/FA is smaller than 1.5 (alt., larger than 0.5). The output of each phase frequency comparator is combined in a manner that provides an output signal QT that remains at a steady level whenever the FB/FA ratio is comprised within the range (1−1/n, 1+1/n) for FB varying from 0 to infinity.

BRIEF DESCRIPTION OF THE DRAWINGS

Other objects, features and advantages of the present invention will become more fully apparent from a detailed description of the preferred embodiment, the appended claims and accompanying drawing Figures, in which:

DESCRIPTION OF THE PREFERRED EMBODIMENT

Figure 1:
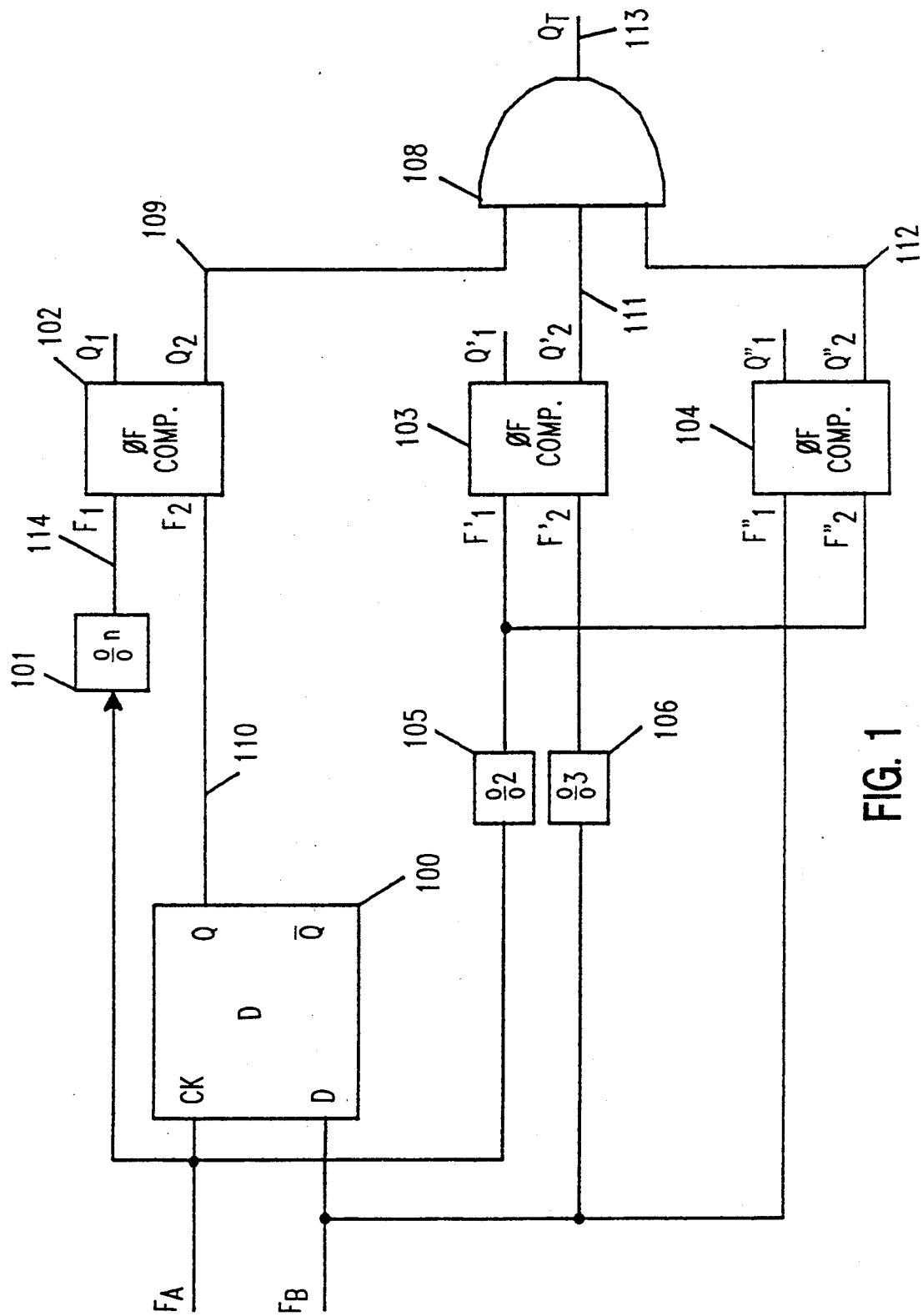
FIG. 1 illustrates the preferred embodiment of the invention.

Referring now to FIG. 1, the clock frequency tester includes a D-latch 100 which is used as a digital frequency mixer. Latch 100 receives the reference clock FA at its clock input and, the clock FB (which is to be tested) at its D-input. The Q output 110 of D-latch 100 provides a signal with a frequency comprised between 0 and FA/2, as a function of the value of FB/FA and according to the following relationship:

$$FQ = (kFA - FB),$$

where k equals the integer value of the result of FB/FA

The reference clock FA is also transmitted to the input of a divide-by-n circuit 101, the output of which is connected to a F1 input (lead 114) of a phase frequency comparator 102. Phase frequency comparator 102 has a second input connection F2 which is connected to the Q output of D-latch 100, (lead 110).

The FA clock is also attached to a divide-by-2 circuit 105, the output of which is connected to a F'1 input lead of a second phase frequency comparator 103 and to a F"2 input connection of a third phase frequency comparator 104. The FB clock is attached to the input of a divide-by-3 circuit 106 and to a F"1 input lead of the phase frequency comparator 104. The output of divide-by-3 circuit 106 is attached to a F'2 input lead of the phase frequency comparator 103. The Q2, Q'2 and Q"2 outputs of, respectively, phase frequency comparator 102, 103 and 104 are each connected to an input of an AND gate 108, the output of which carries the QT signal (lead 113). As will be shown hereinafter, QT signal is representative of the FB/FA ratio and, more particularly, indicates whether the tested frequency FB is comprised within the range (FA−FA/n; FA+-FA/n), wherein n, a positive integer number, is the division factor of the divide-by-n circuit 101.

Figure 2:
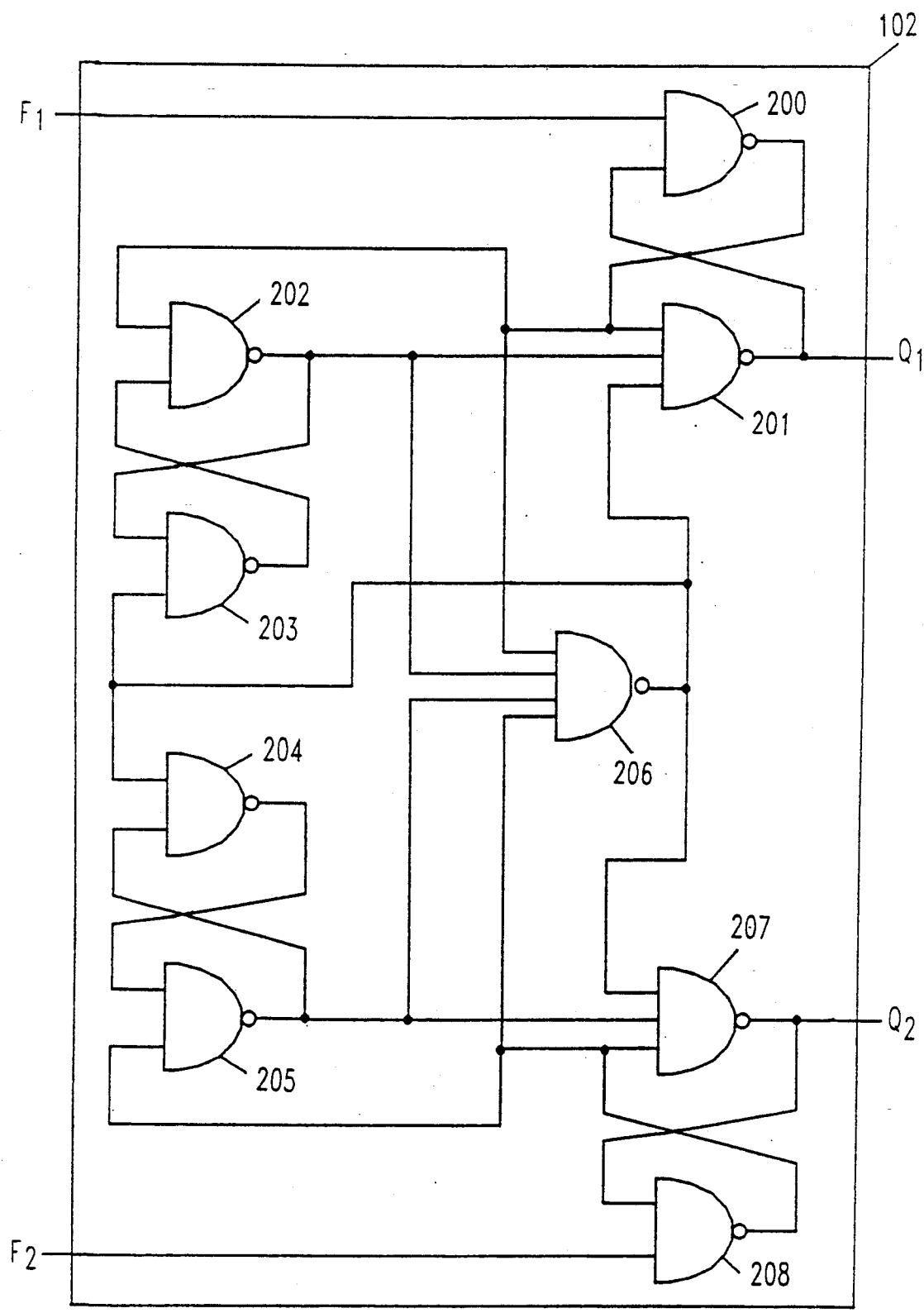
FIG. 2 shows a negative edge triggered phase frequency comparator which is used in the preferred embodiment of the invention.
Figure 6A:
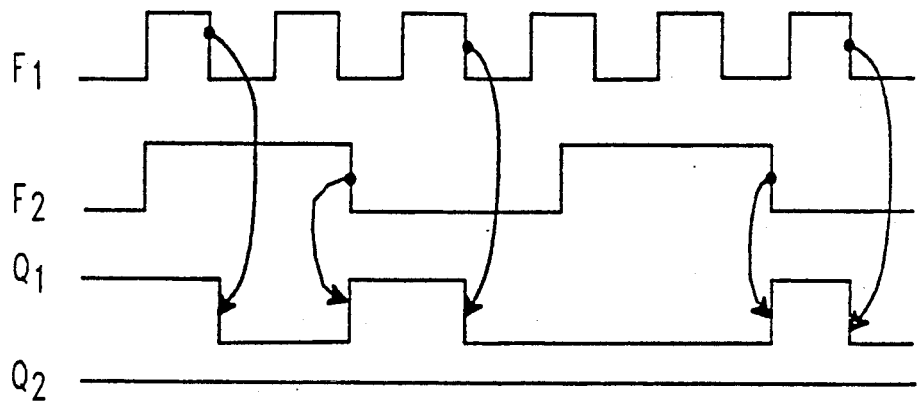
FIG. 6a illustrates timing diagrams highlighting the operating of a phase frequency comparator.

Positive or negative edge triggered phase frequency comparators can be used to embody comparators 102, 103 and 104. FIG. 2 illustrates a negative edge triggered phase comparator 102 which is used in a preferred embodiment of the invention. Phase frequency comparator 102 (or 103, or 104) includes a set of four flip-flops 200-201, 202-203, 204-205 and 207-208, and a four-input-NAND gate 206, the output of which is connected to the reset input of each Set-Reset flip-flop. More accurately, the F1 signal (alt., F'1 signal for comparator 103, F"1 signal for comparator 104) is transmitted to a first input of NAND gate 200, with the second input connected to the output of the NAND gate 201. The output of NAND 200 is connected to a first input of NAND 201, to a first input of NAND 202 and to a first input of NAND 206. NAND 201 has a second input connected to the output of NAND 202, to a first input of NAND 203 and to a second input of NAND 206. NAND 201 has a third input connected to the output of NAND 206, to a second input of NAND 203 and to a first input of NAND 204. NAND 202 has a second input which is connected to the output of NAND 203. NAND 204 has a second input which is connected to the output of NAND 205, to a third input of NAND 206 and to a first input of NAND 207. NAND 204 has an output which is connected to a first input of NAND 205, a second input of which being connected to a fourth input of NAND 206, to a second input of NAND 207 and to the output of NAND 208. NAND 207 has a third input which is connected to the output of NAND 206 and an output which is connected to a first input of NAND 208. F2 signal (or F'2 for comparator 103, or F"2 for comparator 104) is transmitted to a second input of NAND 208. NAND gate 201 and 207, respectively, provide a Q1 and Q2 signal which are representative of the ratio F1/F2. More accurately, whenever F2 is larger than F1, the output Q1 of NAND gate 201 remains at a high level, whereas output Q2 of NAND gate 207 is characterized by the existence of transitions. Conversely, whenever F1 is larger than F2, the output Q2 of NAND gate 207 remains at a high level, while the output Q1 of NAND gate 201 is characterized by the existence of transitions. FIG. 6A shows typical timings of the F1, F2, Q1 and Q2 illustrating the operating of negative edge triggered phase frequency comparator 102.

Figure 6B:
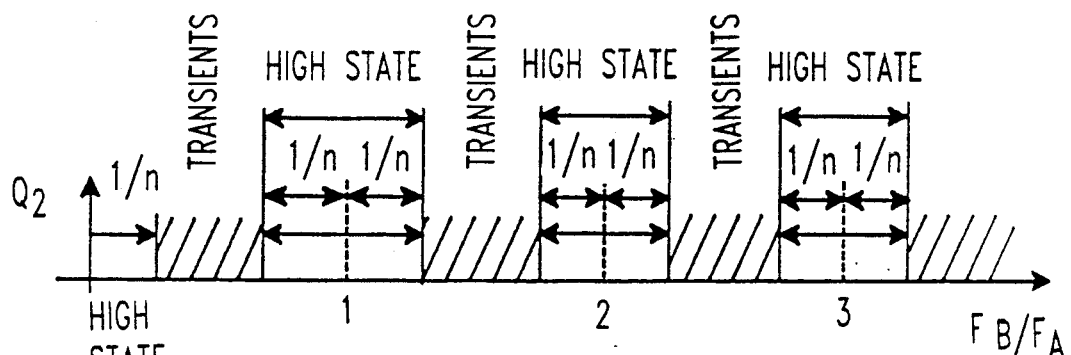
FIG. 6b shows a diagram illustrating the evolution of the output frequency of a comparator with the ratio FB/FA.

Referring now to FIG. 6B, there is shown a diagram illustrating the evolution of the Q2 output signal when the FB/FA ratio varies. Because of the D-latch 100 and the divide-by-n circuit 101, the Q2 signal remains at a high state at the output of phase frequency comparator 102 when the ratio FB/FA is comprised between: (0, 1/n); (1−1/n, 1+1/n); (2−1/n, 2+1/n); (3−1/n, 3+1/n); etc ... Divide-by-2 circuit 105 and divide-by-3 circuit 106, respectively, provide F"1 and F'2 signals which are transmitted to the two inputs of a second phase frequency comparator 103. The Q'2 output of the comparator maintains a steady high state whenever the FB/FA ratio is less than 1.5. The output of divide-by-2 circuit 105 is also connected to a F"1 input of a third phase frequency comparator 104, the F"2 input of which being connected to the tested FB clock. The Q"2 output of the third phase frequency comparator 104 therefore provides a steady high state whenever the FB/FA ratio is larger than 0.5. Thus, for FB/FA to be between 0.5 land 1.5 for an output QT to be provided at AND gate 108, and further since FB must be in the range of (FA−FA/n, FA+FA/n), (which resolves to the ratio FB/FA being in the range (1−1/n, 1+1/n)), it is required that n be greater than 2. AND gate 108, which has three input connections, connected to the Q2, Q'2 and Q"2 output, respectively, of comparators 102, 103 and 104, provides a QT signal on lead 113 which indicates whether the tested clock signal FB is such that the FB/FA ratio is comprised within the (1−1/n, 1+1/n) range.

Figure 6C:
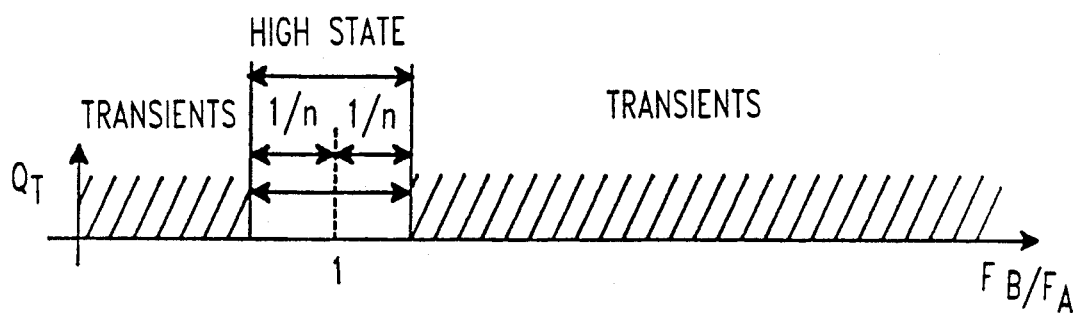
FIG. 6c shows a diagram illustrating the evolution of the output frequency QT of an AND gate with ratio FB/FA.

Referring now to FIG. 6C, there is shown a diagram illustrating the evolution of QT output of AND gate 108 when the ratio FB/FA varies. It can be noticed that, as mentioned above, the QT signal remains at a steady high level whenever the ratio FB/FA remains within the predetermined range of values. Alternatively, whenever the frequency FB decreases or increases with respect to the reference frequency FA, transitions appear on the QT signal pointing out failure in the clock generator FB. The occurrence of this failure can easily be detected by storing the occurrence of a low state in QT signal in an appropriate latch (not shown). It should be noticed that the range $(1-1/n, 1+1/n)$ can be easily adapted and adjusted by changing the factor of division of divide-by-n circuit 101, thereby providing a simple and accurate frequency tester.

Figure 7:
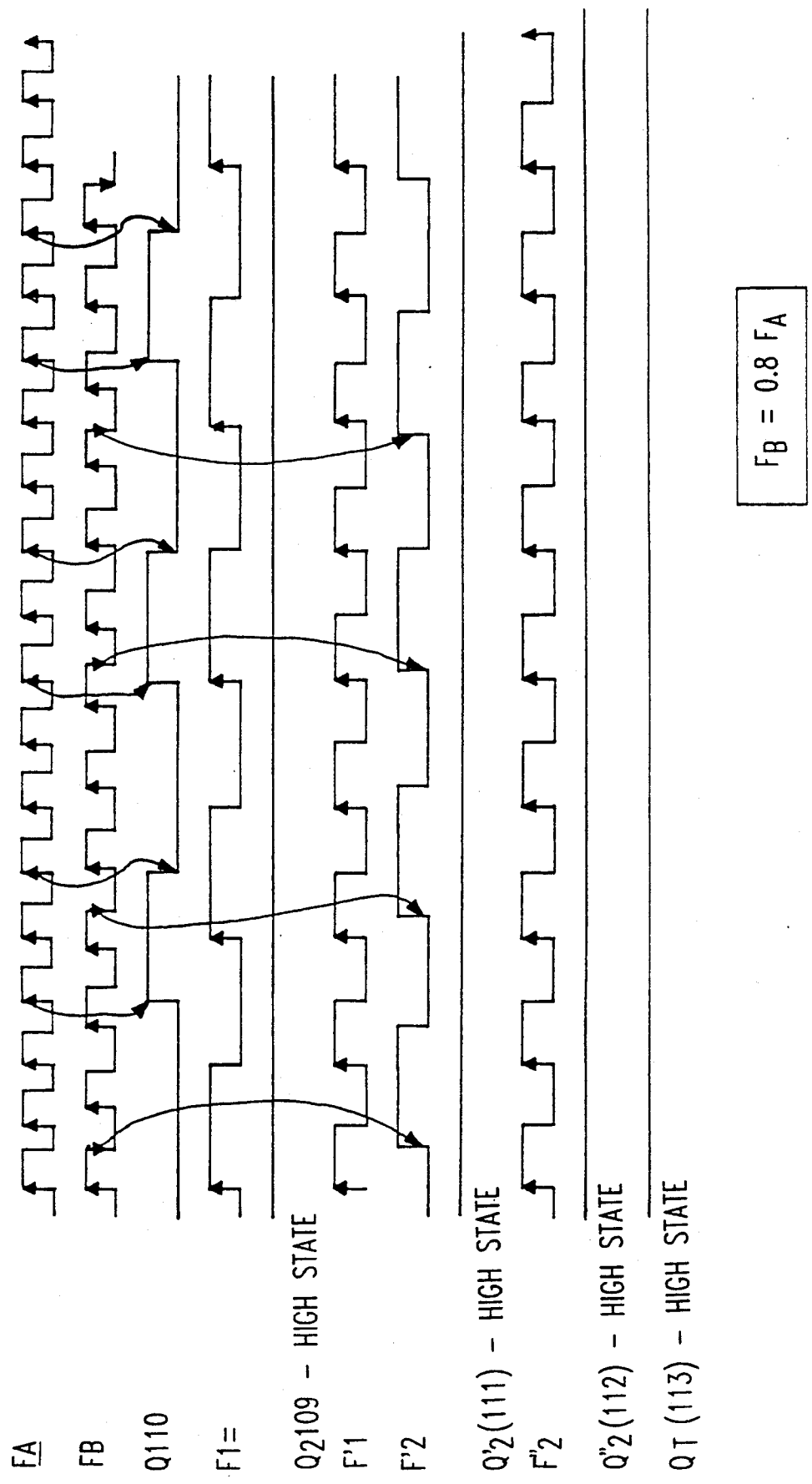
FIGS. 7 and 8 show typical timing diagrams illustrating how the frequency tester circuit operates according to the present invention.
Figure 8:
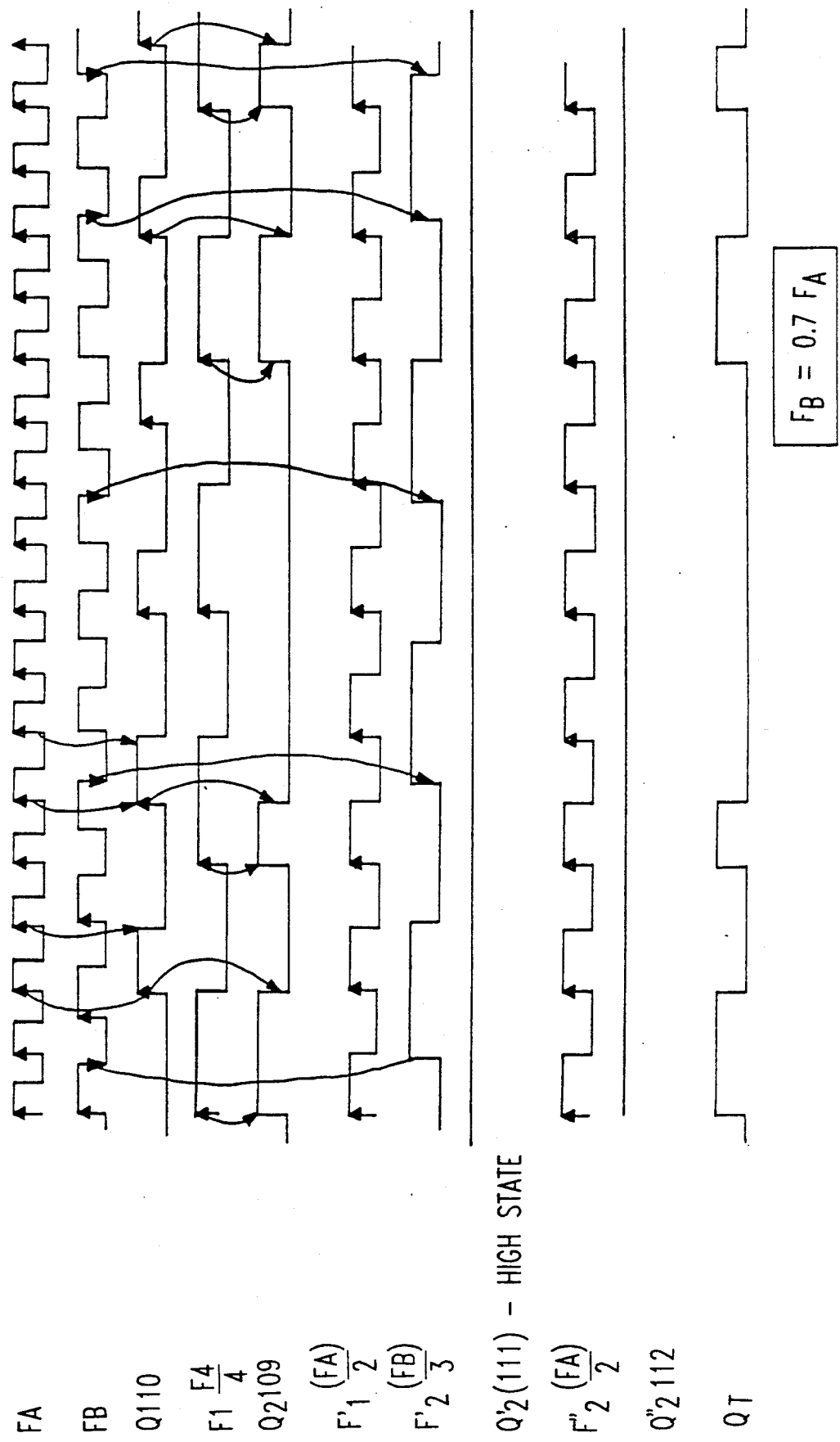

FIGS. 7 and 8 are typical timing diagrams illustrating how the frequency tester operates with a divide-by-4 circuit 101 in accordance to the present invention. The tester indicates, by the presence of a steady high level at the output lead 113 of AND gate 108, whether the FB/FA ratio is within the range (0.75; 1.25). FIG. 7 particularly shows timings of a FB/FA ratio of 0.8, i.e., for a value between the preceding range (0.75; 1.25). Timings are shown of FA, FB, Q output lead 110 of D-latch 100, F1, Q2 on lead 109, F"1, F'2, Q'2 on lead 111, Q"2 on lead 112 and QT on lead 113. Since FB/FA ratio remains within (0.75, 1.25), the QT output signal on lead 113 is at a high level. Alternatively, FIG. 8 shows the corresponding timings for a FB/FA ratio of 0.7, that is, for a value outside the range (0.75; 1.25). In this case, the QT output connection 113 is characterized by transitions that are used to reset a latch (not shown), the low level of which indicates the presence of a failure in the clock generators.

Figure 3:
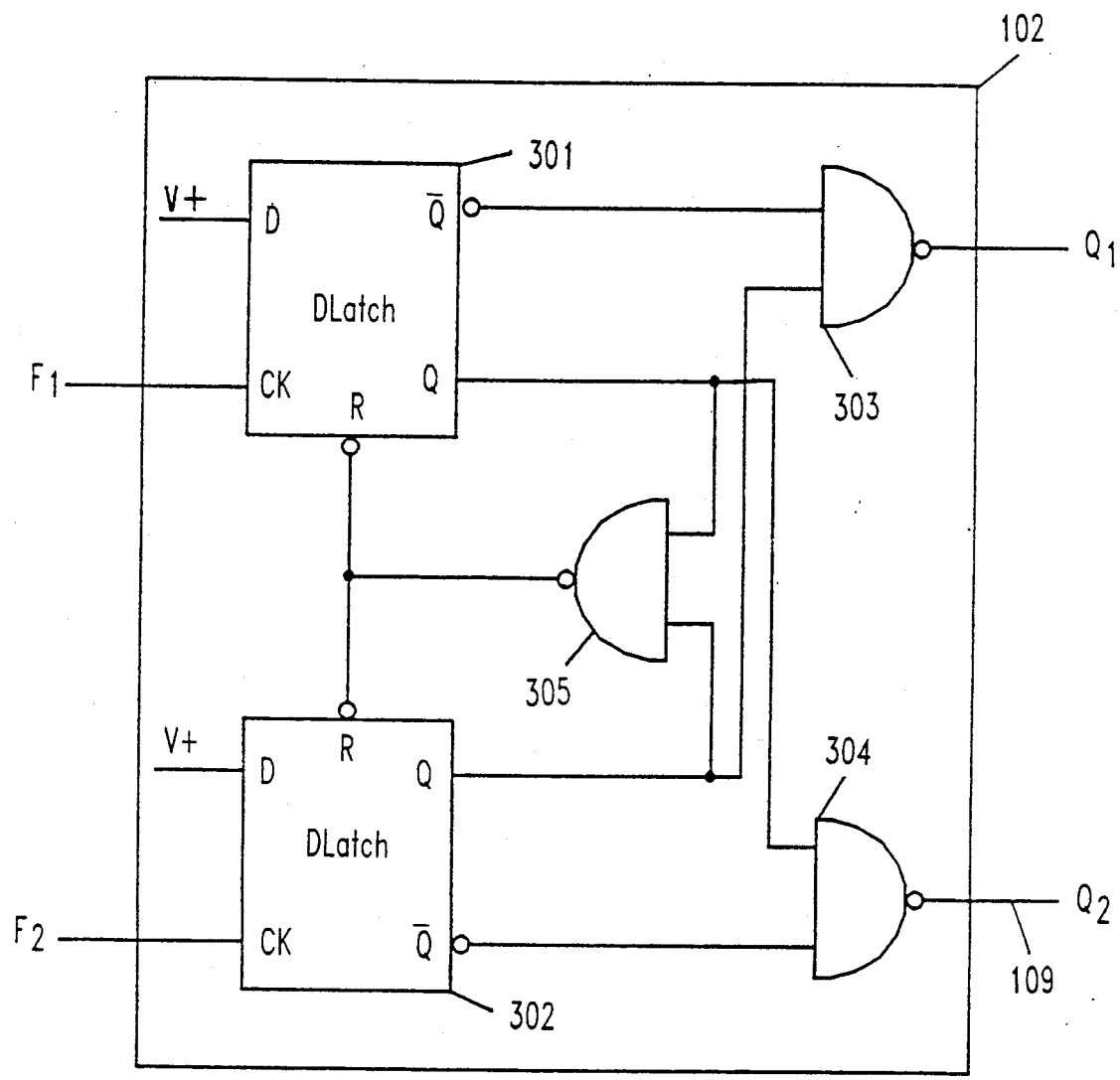
FIG. 3 shows a positive edge triggered phase frequency comparator which is used in the preferred embodiment of the invention.

FIG. 3 illustrates a positive edge triggered phase comparator used in a second preferred embodiment of phase frequency comparators 102, 103 and 104. Phase frequency comparator 102 includes a set of two D-latches 301 and 302 having their clock input, respectively, connected to F1 and F2 signals, and their D-input connected to the positive voltage source V+. The Q output of D-latch 301 is connected to a first input of NAND gate 304 and to a first input of NAND 305. Similarly, the Q output lead of D-latch 302 is connected to a first input of NAND gate 303 and to a second input of NAND 305, the output of which being connected to the reset input leads of D-latches 301 and 302. D-latch 301 has an inverted Q output connection which is attached to a second input of NAND 303. D-latch 302 has an inverted Q output lead which of which providing the desired Q2 signal on lead 109 (alt., lead 111 for phase frequency comparator 103 and lead 112 for phase frequency comparator 104).

Figure 4:
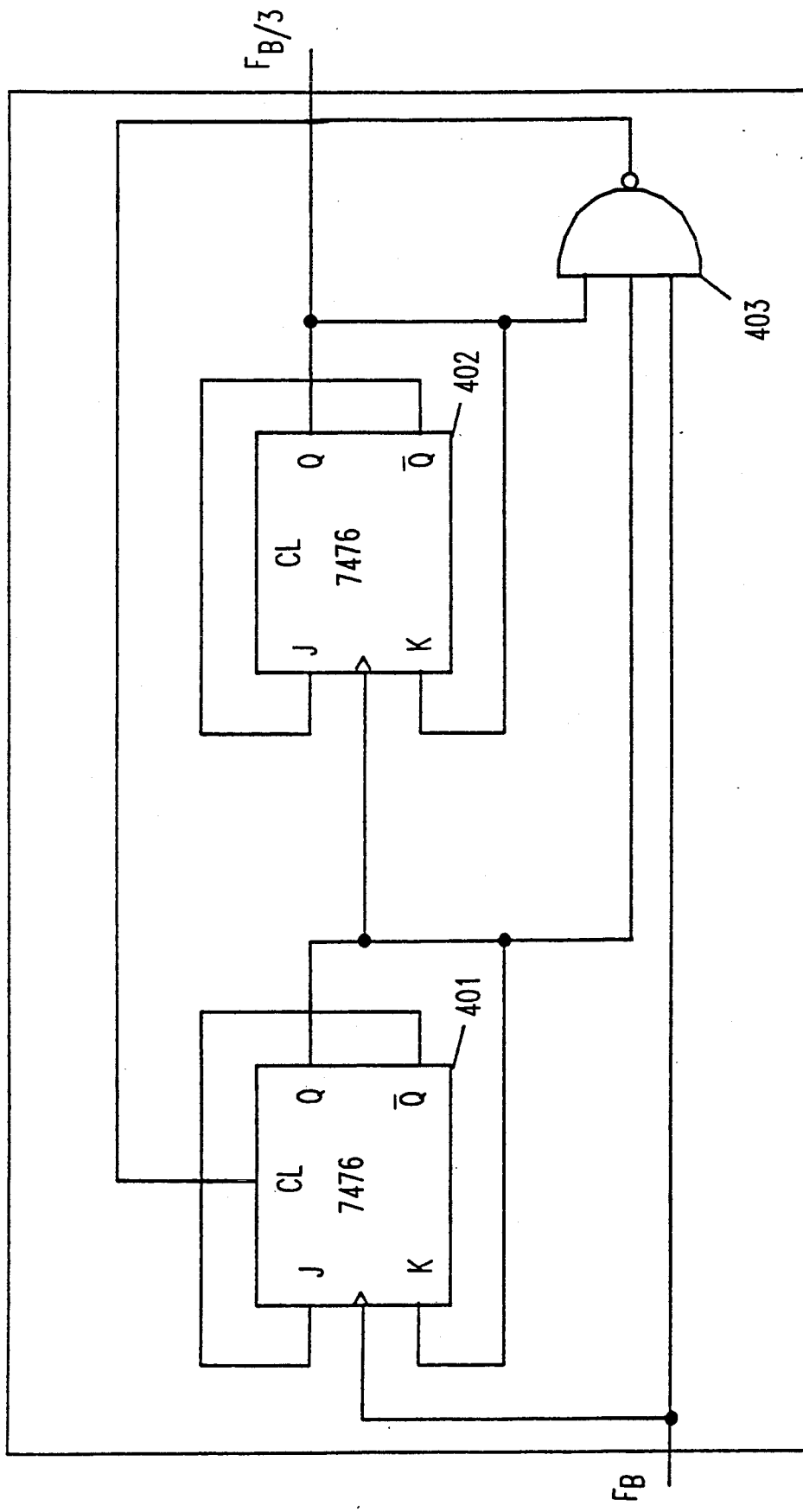
FIG. 4 illustrates a divide-by-3 circuit which is used in the preferred embodiment of the invention.
Figure 5:
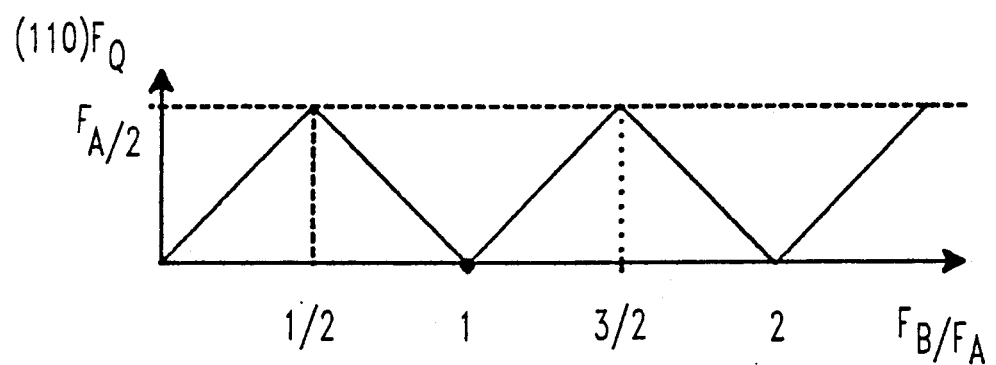
FIG. 5 shows a diagram illustrating the evolution of the output frequency of a frequency mixer with a ratio of FB/FA.

Referring now to FIG. 4, a preferred embodiment of divide-by-3 circuit 106 is described which consists of a negative edge triggered divide-by-3 circuit. Divide-by-3 circuit 106 is made up of a set of two J-K latches 401 and 402, well known in the art as logic circuit Part Number 7476. The FB clock is transmitted to the clock input of latch 401 and to a first input of a NAND gate 403, the output of which being connected to the clear input lead of latch 401. The Q output of 401 is connected to its K input lead, to the clock input of latch 402 and to a second input lead of NAND gate 403. The inverted Q output lead of latches 401 and 402 is respectively connected to the J-input lead of latches 401 and 402. The Q output lead of latch 402 is connected to its K input lead, to a third input of NAND 403 and provides a clock which frequency has a value of FB/3, with a 50% duty cycle.

Although this invention has been disclosed by reference to particular embodiments thereof, many changes and modifications of the invention may become apparent to those skilled in the art without departing from the spirit and scope of the invention.

What is claimed is:

1. A clock frequency tester circuit for determining whether the frequency FB of a test signal produced by a clock to be tested has a value which is comprised within a predetermined range of values centered around the frequency FA of a reference clock signal produced by a reference clock wherein n is a predetermined parameter greater than 2 being characteristic of the accuracy of the tester, said tester receiving said reference clock signal and said test signal which frequency value is to be tested, said tester comprising:

frequency mixer means having a first input connected to said reference clock, a second input connected to the clock to be tested, and an output which provides a mixed output signal;

divide-by-n circuit means for dividing the frequency FA of the reference clock and providing a signal at an output thereof;

phase frequency comparator means having two inputs and an output, said inputs respectively connected to the output of said divide-by-n circuit means and to said frequency mixer means, for generating an output signal which remains at a steady level whenever the output signal of said divide-by-n circuit means has a frequency which is higher than that of said frequency mixer means;

divide-by-2 circuit means connected to said reference clock FA and having an output;

second phase frequency comparator means with two inputs and an output, said inputs respectively connected to said clock to be tested and to the output of said divide-by-2 circuit means, for generating an output signal which remains at a steady level whenever the frequency of the test signal of the clock to be tested is higher than the frequency of the output signal of said divide-by-2 circuit means; and means for combining said output signals of said first and second phase frequency comparators such that an output signal is provided having a steady level only when said frequency FB is contained within the range between $FA-FA/n$ and $FA+FA/n$.

2. A clock frequency tester circuit as in claim 1, wherein said frequency mixer means ia D-latch having its clock-input connected to said reference clock and its D-input connected to the clock to be tested.

3. A clock frequency tester circuit as in claim 1, and further including:

divide-by-3 circuit means connected to said tested clock; and third phase frequency comparator means having two inputs and one output, said inputs respectively connected to the output of said divide-by-2 circuit and to the output of said divide-by-3 circuit, for generating an output signal which remains at a steady level whenever the frequency of the signal generated by said divide-by-2circuit is higher than the frequency of the signal generated by said divide-by-3 circuit; wherein said means for combining further combines the output signal of said third phase frequency comparator means with said output signals of said first and said second phase frequency comparators means such that an output signal is provided having a steady level only when said frequency FB is contained within the range between $FA-FA/n$ and $FA+FA/n$.

4. A clock frequency tester circuit as in claim 3 wherein said first, second and third phase frequency comparator means are positive edge triggered comparators.

5. A clock frequency tester circuit as in claim 4 wherein each of said first, second and third phase frequency comparator means includes first and second D-latches having their clock inputs respectively connected to said two inputs of said phase frequency comparator means and their D-inputs connected to a positive voltage source, such that:

said first D-latch has a Q output which is connected to a first input of a first NAND gate and to a first input of a second NAND gate; said second D-latch has a Q output which is connected to a first input of a third NAND gate and to a second input of said second NAND gate, said second NAND gate having an output which is connected to the reset input lead of said first and said second D-latches and;

said first D-latch has an inverted Q output lead which is connected to a second input of said third NAND gate;

said second D-latch has an inverted Q output lead which is connected to a second input of said first NAND gate; and the output of said first NAND gate providing a steady level whenever the signal received at one of said two inputs has a frequency which is higher than that of the other of said two inputs.

6. A clock frequency tester circuit as in claim 3 wherein said first, second and third phase frequency comparator means are negative edge triggered comparators.

7. A clock frequency tester circuit as in claim 6 wherein each of said first, second and third phase frequency comparator means further includes a set of four Set-Reset flip-flops and a 4-input-NAND gate which has an output connected to the reset input of each said flip-flops.

8. A clock frequency tester circuit as in claim 6, wherein each of said first, second and third phase frequency comparator means further includes a first NAND gate which has a first input connected to one of said two inputs and a second input which is connected to the output of a second NAND gate, and such that:

the output of said first NAND gate is connected to a first input of said second NAND gate, to a first input of a third NAND gate and to a first input of a fourth NAND gate;

said second NAND gate has a second input connected to the output of said third NAND gate, to a second input of said fourth NAND gate and to a first input of a fifth NAND gate;

said second NAND gate has a third input connected to the output of said fourth NAND gate, to a second input of said fifth NAND gate and to a first input of a sixth NAND gate;

said third NAND gate has a second input which is connected to the output of said fifth NAND gate;

said sixth NAND gate has a second input which is connected to the output of a seventh NAND gate, to a third input of said fourth NAND gate and to a first input of a eight NAND gate;

said sixth NAND gate has an output which is connected to a first input of said seventh NAND gate, said seventh NAND gate having a second input which is connected to a fourth input of said fourth NAND gate, to a second input of said eight NAND gate and to the output of a ninth NAND gate;

said eight NAND gate has a third input which is connected to the output of said fourth NAND gate, and an output which is connected to a first input of said ninth NAND gate;

said ninth NAND gate has a second input connected to the other of said two inputs; and said eight NAND gate provides said Q2 signal which remains at a steady level whenever the signal received at one of said two inputs has a frequency which is higher than that of the other of said two inputs.

9. A clock frequency tester circuit as in claim 5 wherein said divide-by-3 circuit includes a first JK-latch which has a clock input connected to said clock to be tested and to a first input of a fourth NAND gate, said fourth NAND gate having an output which is connected to the clear input lead of said first JK-latch;

said first JK-latch has a Q output which is connected to its K input lead, to the clock input of a second JK-latch and to a second input lead of said fourth NAND gate;

said first and second JK-latches each having an inverted Q output lead which is, respectively, connected to their J-input lead; and said second JK-latch has a Q output which is connected to its K input lead, to a third input of said third NAND gate and provides a divided-by-3 clock signal FB/3, with a 50% duty cycle.

10. A clock frequency tester circuit as in claim 8, wherein said third phase frequency comparator means has said first NAND gate provided with a first input F'1 connected to the output of said divide-by-2 circuit means, wherein said ninth NAND gate has a second input F'2 connected to the output of said divide-by-3 circuit and wherein the output signal of said third phase frequency comparator remains at a steady level when the signal provided by said first input F'1 has a frequency which is higher than that of the signal provided by said second input F'2.

11. A clock frequency tester circuit as in claim 8, wherein said second phase frequency comparator means has said first NAND gate provided with a first input F"1 connected to said clock to be tested, wherein said ninth NAND gate has a second input F"2 connected to the output of said divide-by-2 circuit means, and wherein the output signal of said second phase frequency comparator means remains at a steady level when the signal provided by said first input F"1 has a frequency which is higher than that of the signal provided by said second input F"2.

* * * * *